(12) United States Patent
Brueggen et al.

(10) Patent No.: US 10,243,587 B2
(45) Date of Patent: Mar. 26, 2019

(54) MANAGING RESULTS FROM LIST DECODE METHODS

(71) Applicant: HEWLETT PACKARD ENTERPRISE DEVELOPMENT LP, Houston, TX (US)

(72) Inventors: Chris Michael Brueggen, Plano, TX (US); Cesar Garzon, Fort Collins, CO (US); Jonathan George, Fort Collins, CO (US)

(73) Assignee: Hewlett Packard Enterprise Developmetn LP, Houston, TX (US)

( * ) Notice: Subject to any disclaimer, the term of this patent is extended or adjusted under 35 U.S.C. 154(b) by 0 days.

(21) Appl. No.: 15/427,649

(22) Filed: Feb. 8, 2017

(65) Prior Publication Data
US 2018/0226994 A1    Aug. 9, 2018

(51) Int. Cl.
*H03M 13/00* (2006.01)
*H03M 13/15* (2006.01)

(52) U.S. Cl.
CPC ... *H03M 13/1515* (2013.01); *H03M 13/6516* (2013.01)

(58) Field of Classification Search
CPC ............ H03M 13/1515; H03M 13/6516
See application file for complete search history.

(56) References Cited

U.S. PATENT DOCUMENTS

| | | | |
|---|---|---|---|
| 4,646,301 A | | 2/1987 | Okamoto et al. |
| 6,826,735 B2* | | 11/2004 | Ono ................ G01N 21/95684 716/112 |
| 6,990,622 B2* | | 1/2006 | Davis .................. G06F 11/1008 714/746 |
| 7,278,125 B2* | | 10/2007 | Nojima ............... G06F 17/5081 703/14 |
| 7,509,550 B2* | | 3/2009 | Rajski .............. G01R 31/31854 714/726 |
| 7,689,893 B1 | | 3/2010 | Burd |
| 7,765,458 B1* | | 7/2010 | Yang ................. H03M 13/4138 714/795 |

(Continued)

OTHER PUBLICATIONS

Wang, Z. et al., "Nonlinear Multi-Error Correction Codes for Reliable NAND Flash Memories," (Research Paper), Feb. 25, 2011, 16 pages, available at http://mark.bu.edu/papers/222.pdf.

*Primary Examiner* — Esaw T Abraham
(74) *Attorney, Agent, or Firm* — Rathe Lindenbaum LLP

(57) ABSTRACT

Examples disclosed herein relate to very large-scale integration (VLSI) circuit implementations of circuits for managing results from list decode methods. In accordance with some examples disclosed herein, a plurality of potential error patterns for correcting errors in a codeword may be received. The plurality of potential error patterns may be generated using a plurality of different list decode methods. Error patterns among the plurality of potential error patterns may be determined and marked as candidate error patterns using a set of error pattern screens. Error weights may be assigned to the candidate error patterns based on a quantity of bit errors in each symbol included therein. Weights for candidate error patterns that are indicative of a memory device failure may be adjusted using a scaling factor. An error pattern among the candidate error patterns may be selected to correct the errors in the codeword based on the assigned error weights.

20 Claims, 8 Drawing Sheets

(56) References Cited

U.S. PATENT DOCUMENTS

| | | | |
|---|---|---|---|
| 7,949,927 B2 | 5/2011 | Park et al. | |
| 8,037,394 B2 | 10/2011 | Djurdjevic et al. | |
| 8,040,953 B2 * | 10/2011 | Yang | H03M 13/2933 375/240.18 |
| 8,108,759 B2 | 1/2012 | Moon et al. | |
| 8,423,873 B2 | 4/2013 | Yang et al. | |
| 8,762,804 B2 * | 6/2014 | Shah | G06F 11/24 714/736 |
| 9,128,868 B2 * | 9/2015 | Lastras-Montano | G06F 11/1044 |
| 2006/0195756 A1 | 8/2006 | Yoshii | |

* cited by examiner

MANAGING RESULTS FROM LIST DECODE METHODS

BACKGROUND

Reed-Solomon codes may be used to protect data in memory or storage, where the capability to correct and erase burst errors allows various kinds of device failures to be tolerated. In general, a Reed-Solomon code may allow for the correction of up to symbol errors, based on a code distance D (i.e., $\tau < D/2$).

Various error correction methods have been developed to allow for the correction of a larger number of symbol errors (i.e., $\tau \geq D/2$) for some percentage of error patterns. These error correction methods may be referred to as list decoding methods, because they produce a list of potential error patterns (or potentially valid codewords). Given the list of potential error patterns, it is often possible to select the most likely error pattern (or valid codeword) based on higher level information.

BRIEF DESCRIPTION OF THE DRAWINGS

The following detailed description references the drawings, wherein.

DETAILED DESCRIPTION

Figure 1:
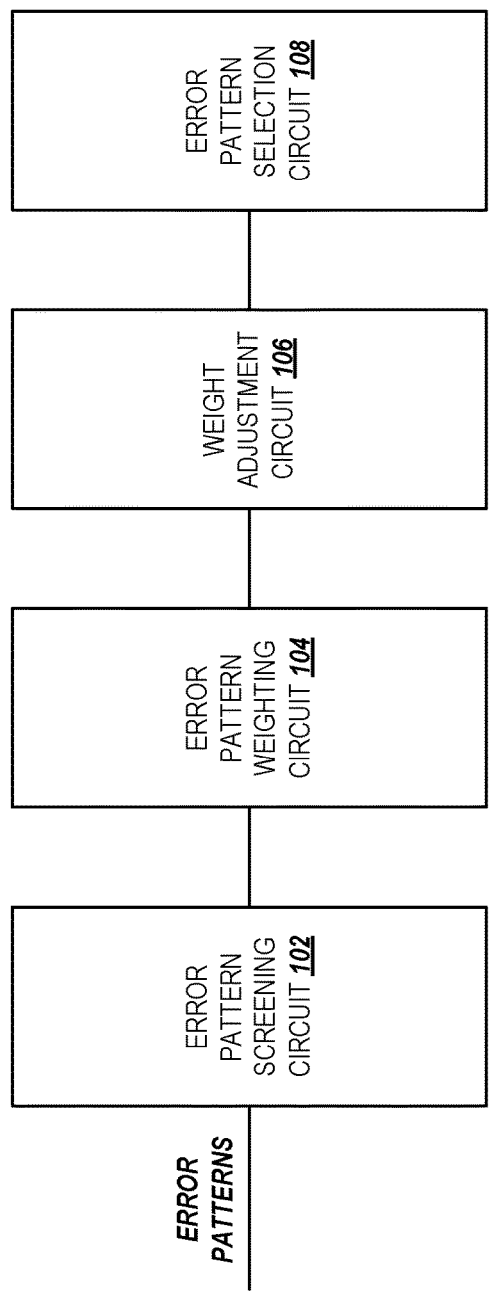
FIG. 1 is a block diagram of an example list decode circuit for managing results from list decode methods.

Examples disclosed herein provide very large scale integration (VLSI) circuits for managing results from list decode methods that allow for the correction of $\tau \geq D/2$ symbol errors in Reed-Solomon codes. The disclosed example circuit implementations are capable of selecting the most likely correctable error patterns given a list of potential correctable error patterns produced by multiple different list decode methods for Reed-Solomon codes.

In accordance with some examples disclosed herein, an example list decode management circuit may receive a plurality of potential error patterns for correcting errors in a codeword. The plurality of potential error patterns may be generated using a plurality of different list decode methods. The example list decode management circuit may determine which potential error patterns among the plurality of potential error patterns that are likely to be real error patterns using a set of error pattern screens and mark them as candidate error patterns. The example list decode management circuit may assign error weights to each of the candidate error patterns based on a quantity of bit errors in each symbol included in the candidate error patterns. A scaling factor may be used to adjust error weights assigned to candidate error patterns indicative of a memory device failure. An error pattern to correct the errors in the codeword may be selected among the candidate error patterns based on the assigned weights.

Reference is now made to the accompanying drawings. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the present disclosure does not limit the disclosed examples. Instead, the proper scope of the disclosed examples may be defined by the appended claims.

The terminology used herein is for the purpose of describing particular examples only and is not intended to be limiting. As used herein, the singular forms "a," "an," and "the" are intended to include the plural forms as well, unless the context clearly indicates otherwise. The term "plurality," as used herein, is defined as two or more than two. The term "another," as used herein, is defined as at least a second or more. The term "coupled," as used herein, is defined as connected, whether directly without any intervening elements or indirectly with at least one intervening elements, unless otherwise indicated. Two elements can be coupled mechanically, electrically, or communicatively linked through a communication channel, pathway, network, or system. The term "and/or" as used herein refers to and encompasses any and all possible combinations of the associated listed items. It will also be understood that, although the terms first, second, third, etc. may be used herein to describe various elements, these elements should not be limited by these terms, as these terms are only used to distinguish one element from another unless stated otherwise or the context indicates otherwise. As used herein, the term "includes" means includes but not limited to, the term "including" means including but not limited to. The term "based on" means based at least in part on.

FIG. 1 is a block diagram of an example list decode management circuit 100 for managing results from list decode methods. As shown in FIG. 1, list decode management circuit 100 may include various circuits and circuit components, such as an error pattern screening circuit 102, an error pattern weighting circuit 104, a weight adjustment circuit 106, and an error pattern selection circuit 108. Other arrangements and numbers of components may be utilized without departing from the examples of the present disclosure.

List decode management circuit 100 may be implemented by an electronic hardware device such as, for example, an application-specific integrated circuit (ASIC) device, a system-on-chip (SoC), or a field-programmable gate array (FPGA). Error pattern screening circuit 102, error pattern weighting circuit 104, weight adjustment circuit 106, and error pattern selection circuit 108 may be electronic and/or digital logic circuits implemented by the hardware device and may be defined in a hardware description language (HDL) such as VHDL or Verilog.

In some implementations, list decode management circuit 100 may be part of a larger memory controller system. List decode management circuit 100 may generally perform error detection and correction for memory devices associated with the memory controller. The memory devices may be volatile (e.g., dynamic random-access memory (RAM) (DRAM), synchronous DRAM (SDRAM), or static RAM (SRAM))

and/or non-volatile memory (e.g., memristor, resistive RAM (RRAM), or phase change RAM (PCRAM)) devices included on one or a plurality of dual in-line memory modules (DIMMs). The DIMMs may be included in a computing system having a processor (or processors) such as a server, personal computing device, or mobile computing device.

The memory controller system may read information from a group of memory devices included in the computing system. Information may be read out of the memory devices one error-correction encoded word (referred to herein as a codeword) at a time. For a read operation, each memory device in the group may contribute a group of symbols to the codeword. For example, a group of ten memory devices may each contribute eight symbols to an 80 symbol codeword. Each symbol may include, for example, eight bits. The codewords may be encoded using various error-correction codes such as Reed-Solomon codes. Each codeword may include a quantity of check symbols for detecting and correcting errors in the codewords. The error-correction code distance D of the codewords may be equal to one plus the quantity of check symbols.

A list decoder circuit (not shown) may receive the codewords and perform error detection and produce a list of potential error patterns that may be used for correction. For each received codeword, the list decoder circuit, which may be implemented in hardware similarly to list decode management circuit 100, may calculate a syndrome by computing an expected codeword and comparing the expected codeword to the received codeword. If there are differences between the expected and received codewords, errors are present in the received codeword. The differences between the expected and received codewords may be collectively referred to as the syndrome of the received codeword. If there are known symbol error locations in the received codeword, referred to as erasures, the baseline syndrome may be recalculated taking the erasures into account.

The syndrome (either the baseline or recomputed syndrome) of the codeword may be used to find locations of the errors in the codeword. To determine the error locations in the codeword, the list decoder circuit may use the syndrome(s) to generate a plurality of potential error patterns. The list decoder circuit may use a plurality of different list decode methods to generate the potential error patterns. In some implementations, the list decoder circuit may generate each of the potential error patterns using a unique list decode method. In some implementations, the list decoder circuit may generate each of the potential error patterns using one of a plurality of different list decode methods. In some implementations, the list decoder circuit may generate the potential error patterns using a combination thereof. In still some other implementations, a plurality of list decoder circuits may each generate a plurality of potential error patterns using one of a plurality of different list decode methods.

The different list decode methods may include, for example, burst error list decode methods (i.e., list decode methods capable of correcting errors caused by memory device failures), random error list decode methods, hybrid error (i.e., combinations of burst errors and random errors) list decode methods, etc.

List decode management circuit 100 may select a potential error pattern among the received potential error patterns to correct the errors in the codeword. However, it may be difficult for list decode management circuit 100 to select the best or most likely error pattern because the list decoder circuit(s) may produce a large and varied list of possible error patterns. Moreover, error correction capability for the codeword may be enhanced in some situations by selecting multiple error patterns for correcting different types of errors (e.g., burst errors and random errors) in the codeword.

To increase the likelihood of selecting the most likely correctable error pattern for the codeword, list decode management circuit 100 may reduce the list of potential error patterns by filtering out unlikely or unrealistic error patterns and assigning weights to the remaining error patterns. Moreover, in some situations list decode management circuit 100 may select multiple types of potential error patterns for correcting different types of errors in the codeword. For example, list decode management circuit 100 may determine that a memory device among a plurality of memory devices contributing symbols to the codeword is failed, and may therefore select an error pattern generated using a burst-error type list decode method for correcting the burst error along with an error pattern generated using a random-error type list decode method for correcting random errors in symbols contributed by the remaining memory devices in the plurality.

As an example of the above, for a Reed-Solomon codeword with 15 check symbols (thus having a code distance D of 16), a burst-error list decoder circuit may produce potential error patterns matching the signature of a memory device failure. If the memory device failure affects eight symbols, each of the produced patterns would have up to eight symbol errors in a contiguous eight-symbol group, plus up to four random symbol errors outside of the contiguous symbol group. A random-error list decoder circuit (or random-error list decoder with extended error-correction capabilities) may produce error patterns having up to eight random symbol errors. Other enhanced random-error list decoder circuits may be capable of producing error patterns having >8 symbol errors.

To reduce the size of the list of potential error patterns, error pattern screening circuit 102 may receive the potential error patterns from the list decoder circuit(s) and determine which potential error patterns are likely or realistic. A potential error pattern may be considered to be unlikely or unrealistic if it does not match, or is not similar to, error patterns expected to be seen by pattern screening circuit 102. For example, pattern screening circuit 102 may receive a potential error pattern having seven single-bit errors, a potential error pattern having contiguous symbol errors (i.e., a memory device failure pattern), and a potential error pattern having four multi-bit symbol errors. Pattern screening circuit 102 may eliminate the four multi-bit symbol error pattern from the list of potential error patterns because an error pattern with four multi-bit symbol errors may be an unexpected or unlikely error pattern.

To determine whether a potential error pattern matches or is similar to expected error patterns, error pattern screening circuit 102 may compare each of the potential error patterns to a set of error pattern screens. The quantity of error pattern screens in a set may be less than or equal to the maximum quantity of random symbol error values included in the potential error patterns. Accordingly, a set of error pattern screens may include ≥N error pattern screens for potential error patterns of N symbol error values.

As an example, for a code distance of 16, an enhanced random-error list decoder circuit may produce error patterns with up to 8 symbol errors. There may be a possibility of correlated bit errors within a given symbol and thus support for error patterns with up to 5 multi-bit symbol errors resulting from the correlation is desired. In the example, a set of error pattern screens may include 6 error pattern screens, each one corresponding to error patterns with a certain number (i.e., 0-5) of multi-bit symbol errors. The first screen (i.e., screen 0) may count the total number of bit errors and compare it to a first threshold. The second screen (i.e., screen 1) may exclude one symbol error which includes the largest number of bit errors, counts the remaining bit errors and compares the quantity of remaining bit errors to a threshold. The third screen (i.e., screen 2) may exclude two symbol errors including the largest quantity of bit errors, and so on. In some uses cases, it may be found that the probability of correlated bit errors in a symbol is low, and thus it may be unlikely that three or more symbol errors in an error pattern include correlated bit errors. As an example of such a use case, list decode management circuit 100 may be included in a system where more than two multi-bit symbol errors resulting from correlation is not expected because of extensive testing done on the system or because the system may have a higher level hardware or firmware solution that "erases", "maps out", etc., memory that is affected by a failure causing correlated bit errors. In this case, the last three screens in the set of screens (i.e., screens 3-5) may be disabled as a result of having some indication as to the low likelihood of correlated bit errors so that the screen set will only signal "pass" for error patterns considered to be realistic.

Each error pattern screen in a set may include a software-configurable threshold. The error pattern screen thresholds may include varying quantities of bit errors. Each error pattern may be compared to the threshold quantity of bit errors in each error pattern screen in parallel and either determined to be a candidate error pattern or provided to the next error pattern screen based on the comparison. Potential error patterns that pass any of the error pattern screens in the set may be determined to be candidate error patterns. Potential error patterns that do not pass any of the error pattern screens in the set may be eliminated.

In some implementations, error pattern screening circuit 102 may exclude various symbol error values from the potential error patterns prior to comparing the quantity of bit errors in the potential error patterns to the thresholds in the error pattern screens. For example, the symbol error value(s) having the kth highest bit error quantities may be excluded in the kth error pattern screen where k progressively increments from 0 to N in the set of N error pattern screens.

In some implementations, each of the potential error patterns may be input to one of a plurality of sets of error pattern screens based on their error pattern type. For example, potential error patterns having random errors (i.e., those resulting from random-error list decode methods) may be compared to a first set of error pattern screens and potential error patterns having errors indicative of a memory device failure (i.e., those resulting from burst-error list decode methods) may be compared to a second set of error pattern screens. The error pattern screens in each of the sets may be configured differently. For example, the different sets of error pattern screens may have differing bit-error quantity thresholds, different quantities of error pattern screens, and/or other different configurations. In some implementations, the set of error pattern screens for filtering potential error patterns having errors indicative of a memory device failure may have fewer error pattern screens and lower threshold quantities of bit errors for each screen than the set of error pattern screens for filtering potential error patterns having random errors. Moreover, error pattern screening circuit 102 may exclude symbol errors contributed by the failed (or suspected failed) memory device from the potential error patterns having errors indicative of a memory device failure before the error patterns are compared to the set of error pattern screens.

Error pattern screening circuit 102 may provide the candidate error patterns to error pattern weighting circuit 104. Error pattern weighting circuit 104 may assign error weights to each of the candidate error patterns based on a quantity of bit errors in each symbol included in the candidate error patterns. In some implementations, for candidate error patterns that are indicative of a memory device failure, error pattern weighting circuit 104 may exclude the symbol errors contributed by the failed memory device from those error patterns before assigning their error weights.

Error pattern weighting circuit 104 may assign error weights to the candidate error patterns based on the quantity of bit errors in each symbol of the candidate error patterns using a weighting schema. Error pattern weighting circuit 104 may select the weighting schema from a plurality of weighting schemas based on a likelihood of the correlation of bit errors in symbols in the candidate error patterns.

To assign an error weight to an error pattern, error pattern weighting circuit 104 may calculate a symbol weight for each symbol in the error pattern and sum the calculated symbol weights. The sum of the calculated symbol weights may be assigned to the error pattern as its error weight. Error pattern weighting circuit 104 may calculate each symbol weight by multiplying the quantity of bit errors in each symbol by a symbol error weight according to the weighting schema. Error pattern weighting circuit 104 may provide the error weights assigned to the candidate error patterns indicative of a memory device failure to weight adjustment circuit 106.

Weight adjustment circuit 106 may adjust error weights assigned to the candidate error patterns that are indicative of a memory device failure. The adjustments may be made using a scaling factor, which may be selected among a plurality of scaling factors based on the likelihood that the memory device is failed. For example, if the memory device failure has not been confirmed (i.e., there is no prior evidence of the memory device failure), the scaling factor may be higher than if the memory device failure matches a known failure (i.e., one which has been confirmed by software or higher level hardware). In one example, if the memory device failure has not been confirmed, the scaling factor may be 4 and if the memory device failure matches a known failure, the scaling factor may be 2.

Error pattern selection circuit 108 may receive the error weights assigned to the candidate error patterns (i.e., the error weights assigned to error patterns generated by random-error list decode methods and the adjusted error weights assigned to error patterns indicative of a memory device failure generated by burst-error list decode methods). Error pattern selection circuit 108 may select, among the candidate error patterns, an error pattern to correct the errors in the codeword based on the assigned error weights. In some implementations, error pattern circuit 108 may select the error pattern assigned the lowest error weight among the candidate error patterns to correct the errors in the codeword.

Figure 2:
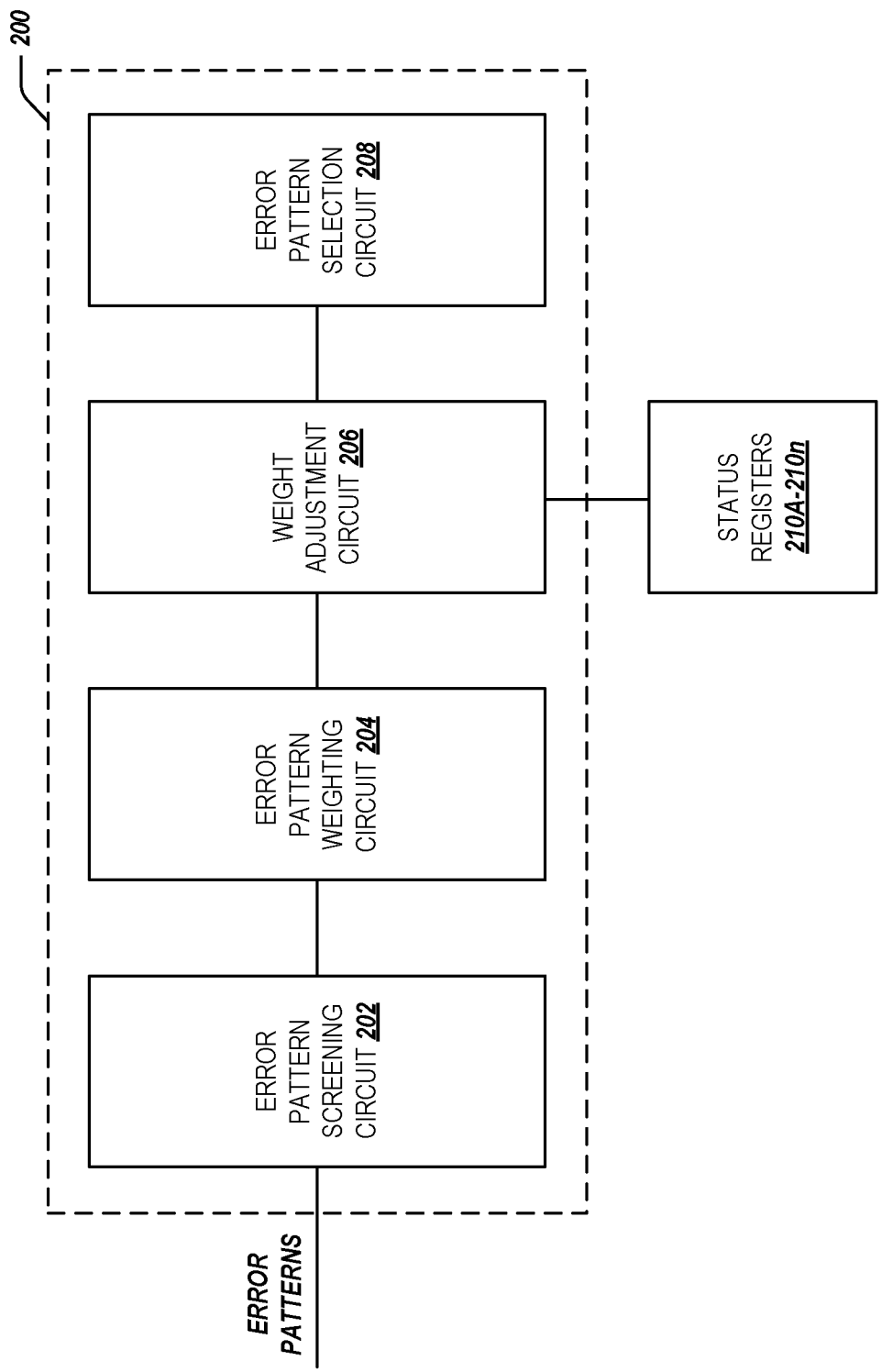
FIG. 2 is a block diagram of an example list decode circuit for managing results from list decode methods.

FIG. 2 is a block diagram of an example list decode management circuit 200 for managing results from list decoding methods. List decode management circuit 200 may be implemented by hardware similar to list decode management circuit 100 and may include electrical and/or logic circuits similar to those included in list decode management circuit 100, such as an error pattern screening circuit 202, an error pattern weighting circuit 204, a weight adjustment circuit 206, and an error pattern selection circuit 208. Other arrangements and numbers of components may be utilized without departing from the examples of the present disclosure.

As shown in FIG. 2, list decode management circuit 200 may be connected to a plurality of status registers 210A-210n. Status registers 210A-210n may store a device status for each of a plurality of memory devices contributing symbols to codewords that are decoded by list decode circuit 200. The device status for each memory device may indicate whether the memory device is healthy and operating normally, is known to have a hard failure (i.e., the memory device exhibits failures on every read from the memory device) or intermittent failure (i.e., the memory device exhibits failures on some reads from the memory device), or is suspected to be failed. A memory device may be known to be failed if it is, for example, flagged as failed by operating software or higher level hardware. A memory device that is not flagged as failed but is exhibiting behavior indicative of a failure may be identified as suspected to be failed by list decode management circuit 200. The operating software or higher level hardware may subsequently confirm that the memory device has in fact failed or not failed, and the status in status registers 210A-210n may accordingly be updated to reflect the status change.

Weight adjustment circuit 206 may retrieve the device statuses of the memory devices contributing symbols to codewords and may adjust error weights assigned to candidate error patterns for correcting errors in the codewords that are indicative of a device failure based on the retrieved device statuses. For example, weight adjustment circuit 206 may select different scaling factors for adjusting the error weights assigned to the candidate error patterns based on whether or not the memory device failure has been confirmed in status registers 210A-210n. As an example, weight adjustment circuit 206 may, in response to determining that the memory device is confirmed (i.e., its status in status registers 210A-210n indicates the failure is known), select a first (lower magnitude) scaling factor as the scaling factor. As an example, weight adjustment circuit 206 may, in response to determining that the memory device is not confirmed (i.e., its status in status registers 210A-210n indicates that either the failure is suspected or that the memory device is healthy and operating normally), select a second (higher magnitude) scaling factor as the scaling factor.

Other arrangements and numbers of scaling factors may be utilized without departing from the examples of the present disclosure. For example, weight adjustment circuit 206 may select from among three different scaling factors, a first scaling factor (lowest magnitude) for known/confirmed memory device failures, a second scaling factor (highest magnitude) for unknown/unconfirmed memory device failures, and a third scaling factor (between the magnitudes of first and second scaling factors) for suspected memory device failures.

Figure 3:
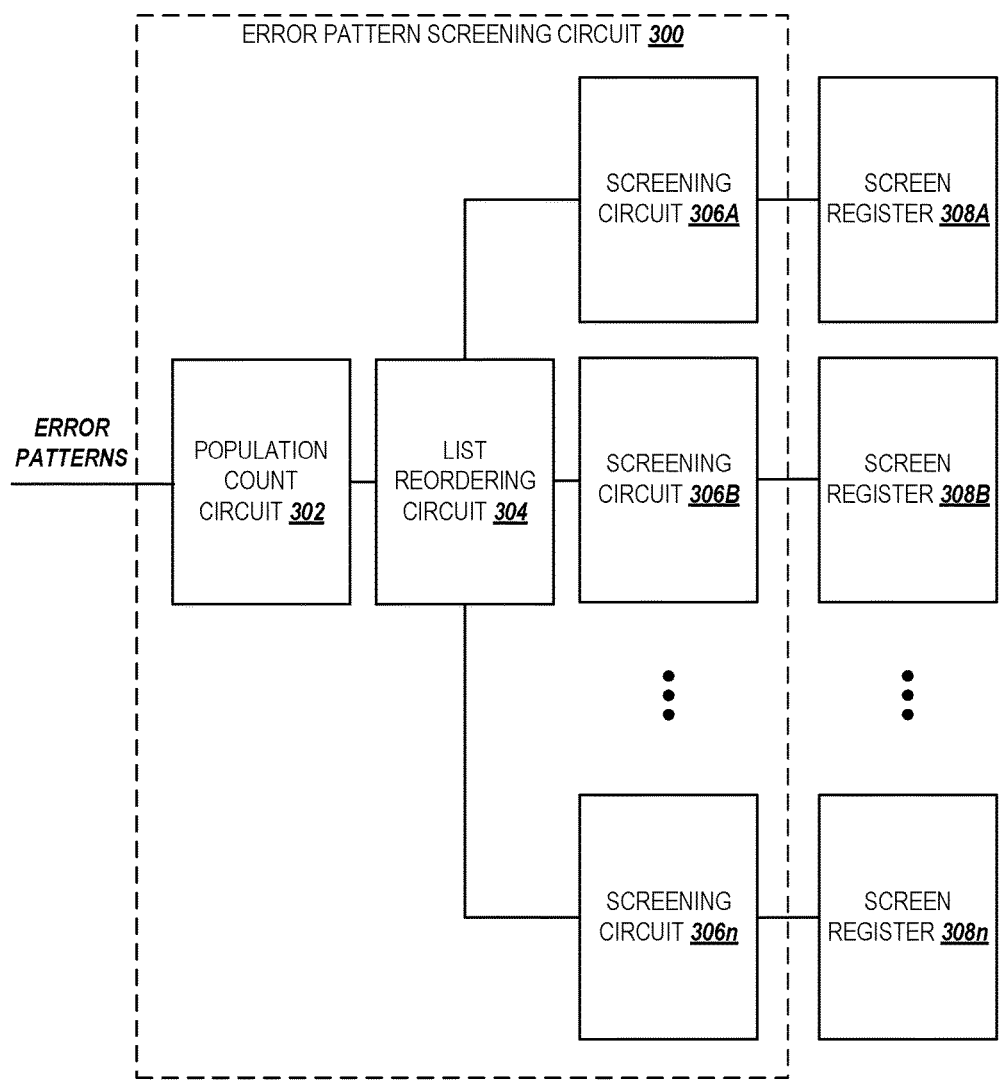
FIG. 3 is a block diagram of an example error pattern screening circuit for managing results from list decode methods.

FIG. 3 is a block diagram of an example error pattern screening circuit 300 for managing results from list decode methods. Error pattern screening circuit 300 may be used to implement error pattern screening circuit 102 of FIG. 1, error pattern screening circuit 202 of FIG. 2, and the associated functionalities described above or vice-versa. As shown in the example illustrated in FIG. 3, error pattern screening circuit 300 may include a population count circuit 302, a list reordering circuit 304, and a plurality of screening circuits 306A-306n. These circuits may be implemented in hardware similarly to error pattern screening circuit 102 of FIG. 1 and/or error pattern screening circuit 202 of FIG. 2, generally. The number and arrangement of these components is an example only and provided for purposes of illustration. Other arrangements and numbers of components may be utilized without departing from the examples of the present disclosure. For example, error pattern screening circuit 300 may include any number of screening circuits.

As shown in FIG. 3, population count circuit 302 may receive potential error patterns for correcting errors in a codeword. Each potential error pattern may include a list of symbol error locations and a corresponding list of symbol error values. Population count circuit 302 may calculate a population count value for each symbol error value in a potential error pattern by adding up the number of bit errors in each of the symbol error values. Population count circuit 302 may place the population count values for the symbol error values into a list. List reordering circuit 304 may reorder the population count values in the list from lowest population count value (i.e., population count value with the least quantity of bit errors) to the highest population count value (i.e., population count value with the greatest quantity of bit errors).

As an example of the above, population count circuit 302 may receive a potential error pattern having a list of eight symbol error values (e.g., {0x02, 0x34, 0x50, 0x40, 0xc, 0xf8, 0x08, 0xa5}). Population count circuit 302 may perform a population count on the eight symbol error values to generate a list of corresponding population count values (e.g., {1, 3, 2, 1, 2, 5, 1, 4}). List reordering circuit 304 may receive the list of population count values and reorder them from lowest population count value to highest population count value (e.g., {1, 1, 1, 2, 2, 3, 4, 5}).

The ordered list of population count values may be provided to screening circuits 306A-306n, which may compare, in parallel, the list of population count values to a set of progressive error screens stored in screen registers 308A-308n. If the list of population count values for the potential error pattern passes any of the error screens, the potential error pattern may be deemed as likely or correctable and may therefore be identified as a candidate error pattern. Each of screening circuits 306A-306n may retrieve and apply a respective error screen from its associated one of screen registers 308A-308n. For example, screening circuit 306A may retrieve and apply the error screen stored in screen register 308A, and so on.

Each error screen may be progressive in that the symbol error value(s) having the kth highest population count value(s) may be excluded in the kth error pattern screen where k progressively increments from 0 to N in a set of N error pattern screens. Accordingly, and as an example, 0 symbol error values may be excluded from error screen 0, the symbol error value with the highest population count value may be excluded from error screen 1, the symbol error values with the two highest population count values may be excluded from error screen 2, and so on progressively to error screen N, where the symbol errors with the N highest population count values are excluded.

Each error screen stored in screen registers 308A-308n may include a threshold quantity of bit errors. The threshold quantity of bit errors may decrease as population count values are excluded in each progressive error screen. Returning to the example above, error screen 0 (where no population count values are excluded) may include a threshold quantity of eight bit errors, error screen 1 (where the highest population count value is excluded) may include a threshold quantity of six bit errors, error screen 2 (where the two highest population count value is excluded) may include a threshold quantity of four bit errors, and so on.

Each of screening circuits 306A-306n may add up all of the population count values for an error pattern, excluding the kth highest population count value(s), which may result in a total bit error quantity for the error pattern. Each of screening circuits 306A-306n may compare the total bit error quantity to a threshold in a error pattern screen stored in a corresponding screen register among screen registers 308A-308n to determine whether to total bit error quantity for the error pattern is less than the threshold. If any of screening circuits 306A-306n finds that its total bit error quantity is less than its corresponding threshold, the error pattern may be determined to be likely or realistic, and may therefore may be determined as a candidate error pattern.

Figure 4:
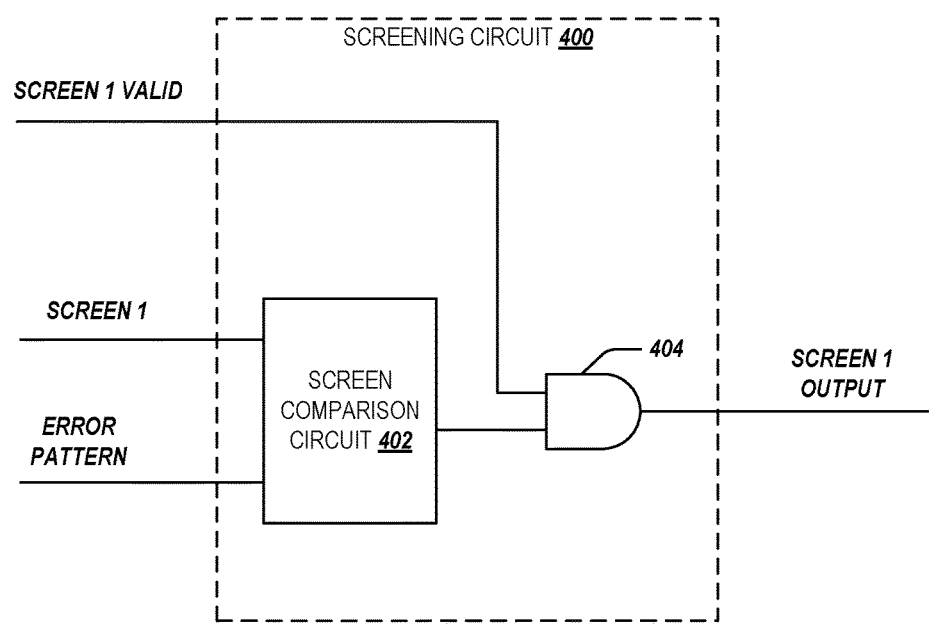
FIG. 4 is a block diagram of an example screening circuit for managing results from list decode methods.

FIG. 4 is a block diagram of an example screening circuit 400 for managing list decode methods. Screening circuit 400 may be used to implement error pattern screening circuits 306A-306n of FIG. 3 and their associated functionalities. As shown in the example illustrated in FIG. 4, screening circuit 400 may include a screen comparison circuit 402 and an AND gate 404. These circuits may be implemented in hardware similarly to screening circuits 306A-306n, generally. The number and arrangement of these components is an example only and provided for purposes of illustration. Other arrangements and numbers of components may be utilized without departing from the examples of the present disclosure.

As shown in FIG. 4, screen comparison circuit 402 may receive potential error patterns and apply error screens to them one at a time. Screen comparison circuit 402 may retrieve SCREEN 1 from, for example, a register (e.g., one of screen registers 308A-308n of FIG. 3) and apply SCREEN 1 to potential error patterns one at a time. In some implementations, SCREEN 1 may be a threshold, such as a threshold quantity of bit errors. The result of the comparison may be a low signal (i.e., a 0 value) if the error pattern exceeds the threshold in SCREEN 1 and a high signal (i.e., a 1 value) if the error pattern does not exceed the threshold in SCREEN 1, or vice-versa. The output signal from screen comparison circuit 402 may be fed into AND gate 404. AND gate 404 may receive a SCREEN 1 VALID signal, which may be a high signal, and AND the SCREEN 1 VALID signal and the output signal from screen comparison circuit 402. The output signal (i.e., SCREEN 1 OUTPUT) may be a high signal if both the SCREEN 1 VALID signal and the output signal from screen comparison circuit 402 are high signals (thus indicating the error pattern passes SCREEN 1) and a low signal if not.

Figure 5A:
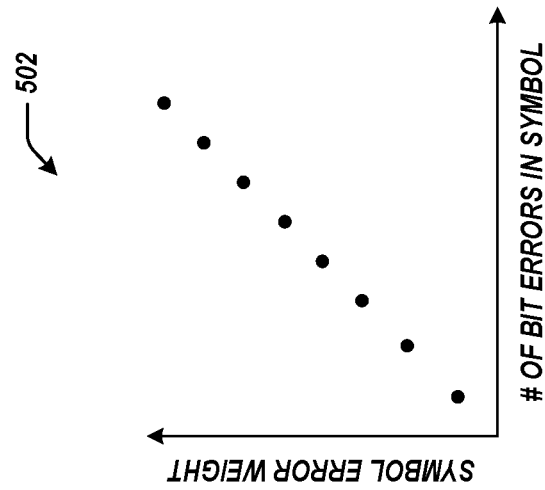
FIGS. 5A-5C are illustrations of example symbol error weighting schemas for managing results from list decode methods.
Figure 5B:
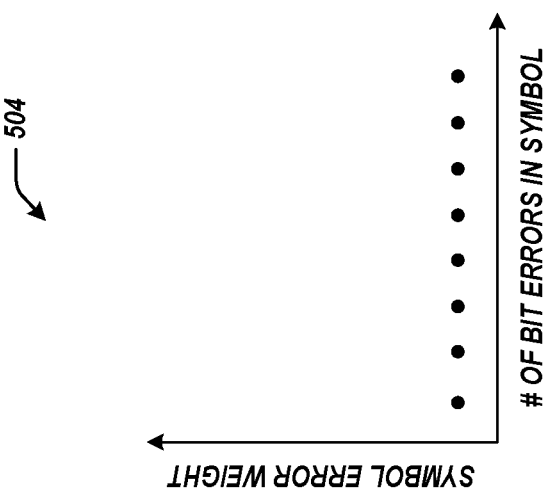
Figure 5C:
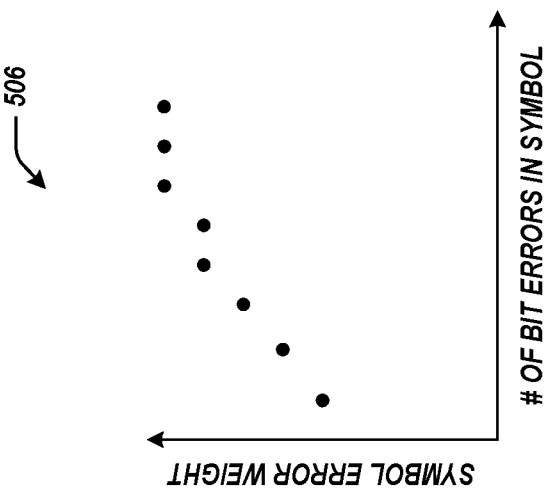

FIGS. 5A-5C are illustrations of example symbol error weighting schemas 502-506 for managing list decode methods. Error weighting schemas may be used by an error pattern weighting circuit (e.g., error pattern weighting circuit 104 of FIG. 1, error pattern weighting circuit 204 of FIG. 2, etc.) to assign error weights to candidate error patterns based on a quantity of bit errors in each symbol included in the candidate error patterns.

For each symbol in a potential error pattern, the error pattern weighting circuit may calculate a symbol weight by multiplying a quantity of bit errors in each symbol by a symbol error weight according to a weighting schema. The error pattern weighting circuit may sum the calculated symbol weights and assign the summation to the potential error pattern as its error weight.

The weighting schema may be configurable by software. The weighting schema may be chosen based on the likelihood of a correlation of bit errors in the symbols in the potential error pattern. Bit errors within a given symbol may be correlated if the cause of the bit errors is related, such as where bit errors in a given symbol are caused by a memory device failure or a bus wire failure. The likelihood of a correlation of bit errors may be based on various factors. In one example, a correlation of bit errors may be likely where there is knowledge of possible structural failures within a memory device and the codeword symbols are stored in the memory in such a way that multiple bits of the symbols are affected by the failure. As another example, correlation of bit errors may be somewhat likely where there is knowledge of a bus wire failure and where multiple bit errors are experienced in the codeword symbols transferred to or from a memory device on the faulty bus wire.

In some implementations error weighting schema 502 illustrated in FIG. 5A may be selected to assign an error weight to a potential error pattern based on a correlation of bit errors in the symbols in the potential error pattern being not likely. As shown in FIG. 5A, weighting schema 502 may specify a linear and directly proportional relationship between quantity of bit errors in a symbol and its assigned symbol error weight. Table 1 below illustrates an example of a relationship between quantity of bit errors in a symbol and its associated symbol error weight in weighting schema 502:

TABLE 1

| | Bit Error Quantity | | | | | | | |
|---|---|---|---|---|---|---|---|---|
| | 1 | 2 | 3 | 4 | 5 | 6 | 7 | 8 |
| Symbol Error Weight | 1 | 2 | 3 | 4 | 5 | 6 | 7 | 8 |

In some implementations error weighting schema 504 illustrated in FIG. 5B may be selected to assign an error weight to a potential error pattern based on a correlation of bit errors in the symbols in the potential error pattern being very likely. As shown in FIG. 5B, weighting schema 504 may specify a constant symbol error weight for all bit error quantities. Table 2 below illustrates an example relationship between quantity of bit errors in a symbol and its associated symbol error weight in weighting schema 504:

TABLE 2

| | Bit Error Quantity | | | | | | | |
|---|---|---|---|---|---|---|---|---|
| | 1 | 2 | 3 | 4 | 5 | 6 | 7 | 8 |
| Symbol Error Weight | 1 | 1 | 1 | 1 | 1 | 1 | 1 | 1 |

In some implementations error weighting schema 506 illustrated in FIG. 5C may be selected to assign an error weight to a potential error pattern based on a correlation of bit errors in the symbols in the potential error pattern being somewhat likely. As shown in FIG. 5C, weighting schema 506 may specify a non-linear relationship between quantity of bit errors in a symbol and its assigned symbol error weight. Table 3 below illustrates an example relationship between quantity of bit errors in a symbol and its associated symbol error weight in weighting schema 506:

TABLE 3

| | Bit Error Quantity | | | | | | | |
|---|---|---|---|---|---|---|---|---|
| | 1 | 2 | 3 | 4 | 5 | 6 | 7 | 8 |
| Symbol Error Weight | 4 | 5 | 6 | 7 | 7 | 8 | 8 | 8 |

Figure 6:
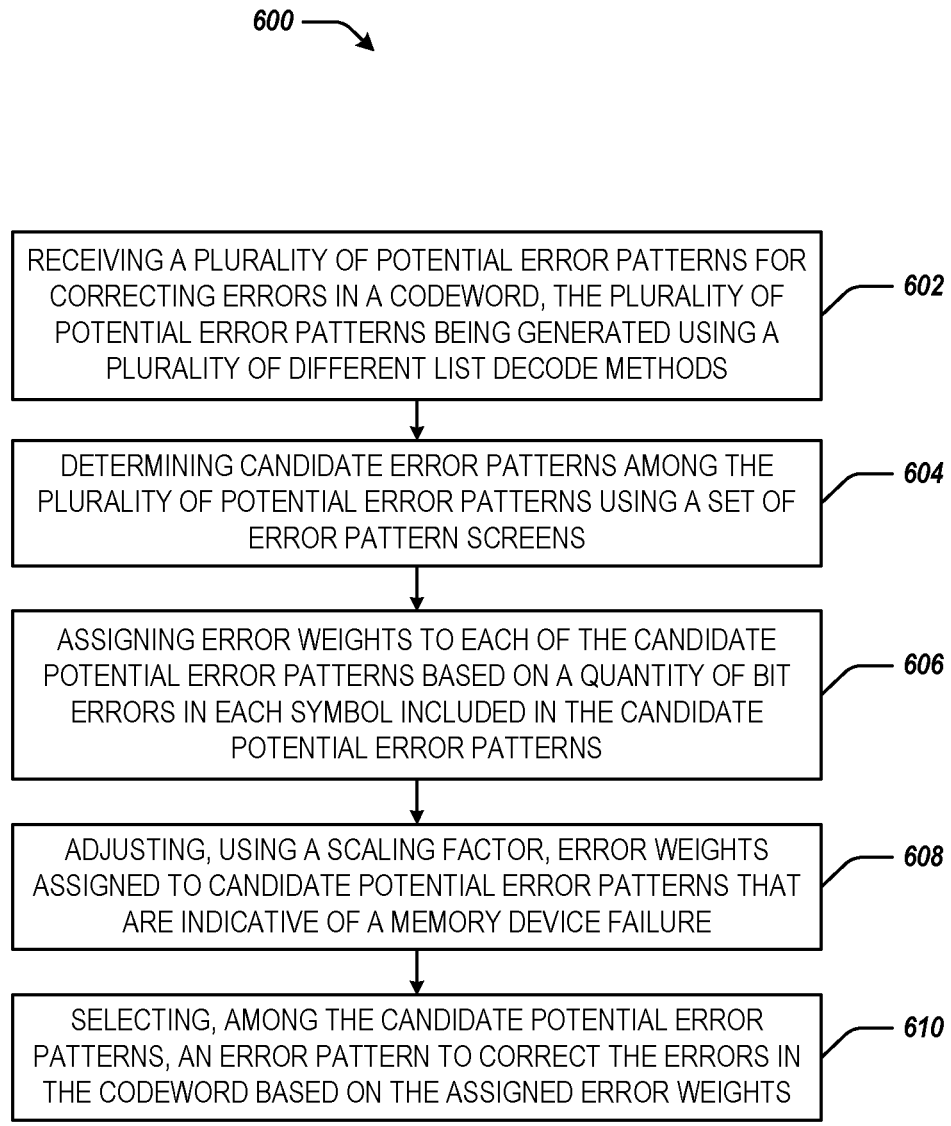
FIG. 6 is a flowchart of an example method for managing results from list decode methods.

FIG. 6 is a flowchart depicting an example method 600 for managing results from list decode methods. Method 600 may be executed or performed, for example, by some or all of the system components described above in list decode management circuit 100 of FIG. 1, list decode management circuit 200 of FIG. 2, error pattern screening circuit 300 of FIG. 3, and/or screening circuit 400 of FIG. 4. Other suitable systems may be used as well. In some examples, steps of method 600 may be executed substantially concurrently or in a different order than shown in FIG. 6. In some examples, method 600 may include more or less steps than are shown in FIG. 6. In some examples, some of the steps of method 600 may, at certain times, be ongoing and/or may repeat.

At block 602, method 600 may include receiving a plurality of potential error patterns for correcting errors in a codeword. The plurality of potential error patterns being generated using a plurality of different list decode methods, such as burst-error list decode methods (i.e., method for correcting errors resulting from memory device failures) and random-error list decode methods. Error pattern screening circuit 102 of FIG. 1, error pattern screening circuit 202 of FIG. 2, and/or error pattern screening circuit 300 of FIG. 3 may be responsible for implementing block 602.

At block 604, method 600 may include determining, as candidate error patterns, likely potential error patterns among the plurality of potential error patterns received at 602 using a set of error pattern screens. Error pattern screening circuit 102 of FIG. 1, error pattern screening circuit 202 of FIG. 2, and/or error pattern screening circuit 300 of FIG. 3 may be responsible for implementing block 604.

At block 606, method 600 may include assigning error weights to each of the candidate error patterns based on a quantity of bit errors in each symbol included in the candidate error patterns. Error pattern weighting circuit 104 of FIG. 1 and/or error pattern weighting circuit 204 of FIG. 2 may be responsible for implementing block 606.

At block 608, method 600 may include adjusting, using a scaling factor, error weights assigned to candidate error patterns that are indicative of a memory device failure. Weight adjustment circuit 106 of FIG. 1 and/or weight adjustment circuit 206 of FIG. 2 may be responsible for implementing block 608.

At block 610, method 600 may include selecting, among the candidate error patterns, an error pattern to correct the errors in the codeword based on the assigned error weights. Error pattern selection circuit 108 of FIG. 1 and/or error pattern selection circuit 208 of FIG. 2 may be responsible for implementing block 610.

Figure 7:
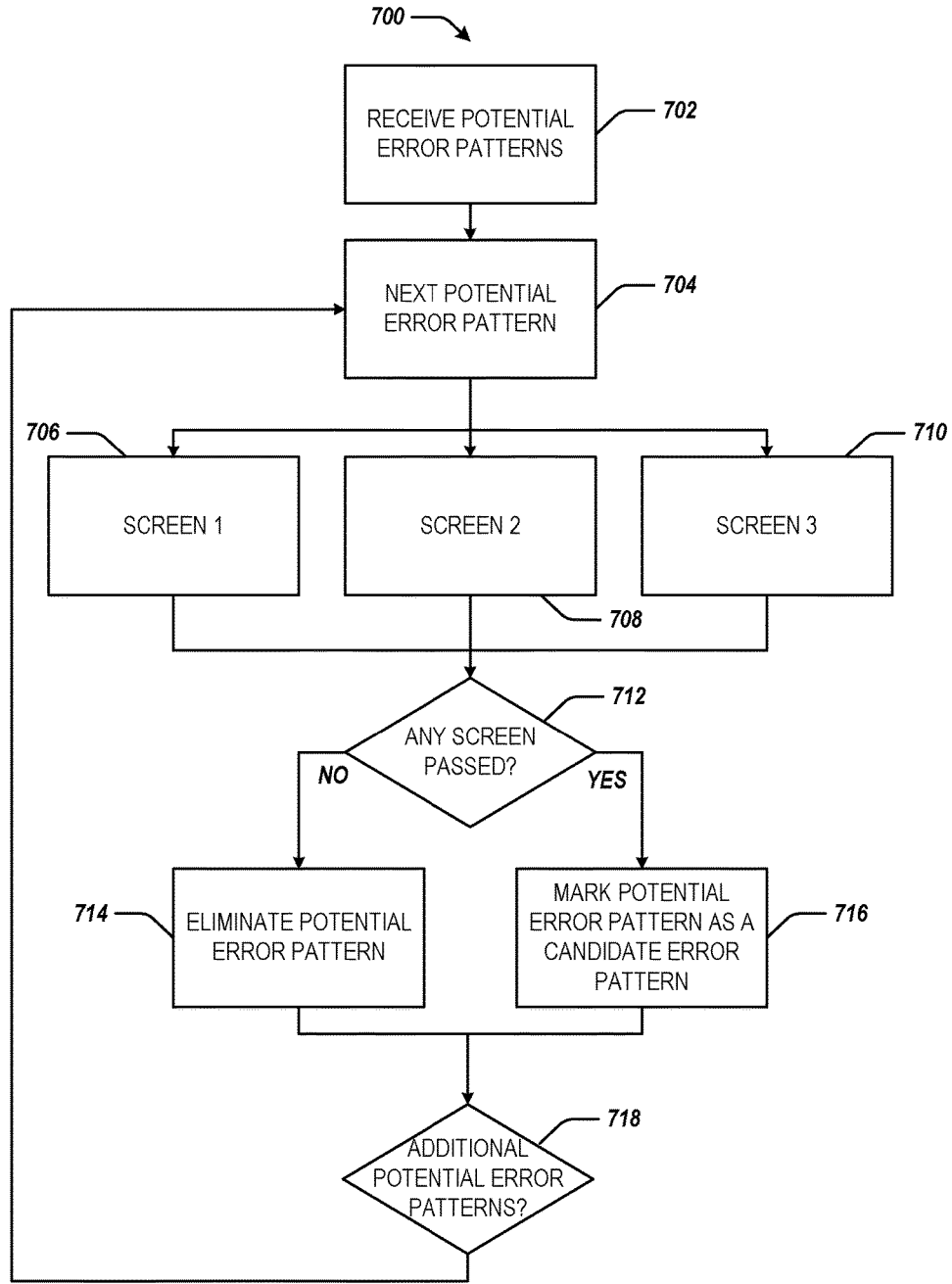
FIG. 7 is a flowchart of an example method for managing results from list decode methods.

FIG. 7 is a flowchart depicting an example method 700 for managing results from list decode methods. Method 700 may be executed or performed, for example, by some or all of the components described above in error pattern screening circuit 102 of FIG. 1, error pattern screening circuit 202 of FIG. 2, error pattern screening circuit 300 of FIG. 3, and/or screening circuit 400 of FIG. 4. Other suitable systems may be used as well. In some examples, steps of method 700 may be executed substantially concurrently or in a different order than shown in FIG. 7. In some examples, method 700 may include more or less steps than are shown in FIG. 7. In some examples, some of the steps of method 700 may, at certain times, be ongoing and/or may repeat.

At block 702, method 700 may include receiving a plurality of potential error patterns for correcting errors in a codeword. The plurality of potential error patterns being generated using a plurality of different list decode methods, such as burst-error list decode methods and random-error list decode methods. At block 704, the next potential error pattern may be selected and compared to a set of screens 706-710 in parallel.

Screen 1 at block 706 may include a first threshold quantity of bit errors. Block 706 may include comparing a quantity of bit errors in the selected potential error pattern to the first threshold quantity of bit errors. The results of the comparison may be provided to block 712.

At block 708, Screen 2 may include excluding the symbol error value with the highest population count value from the selected potential error pattern, counting the bit error quantities in the remaining symbol error values, and comparing the bit error quantities to a second threshold quantity of bit errors. The second threshold quantity of bit errors may be less than the first threshold quantity of bit errors. The results of the comparison may be provided to block 712.

Screen 3 at block 710 may include excluding the symbol error values with the two highest population count value from the selected potential error pattern, counting the bit error quantities in the remaining symbol error values, and comparing the bit error quantities to a third threshold quantity of bit errors. The third threshold quantity of bit errors may be less than the first and second thresholds. The results of the comparison may be provided to block 712.

At block 712, method 700 may include determining whether any of the selected potential error pattern passed any of the error screens in blocks 706-710. If so (block 712—YES), the selected potential error pattern may be determined to be a candidate error pattern at block 716. If the selected potential error pattern did not pass any of the error screens (block 712—NO), then the selected potential error pattern may be eliminated at block 714.

At block 718, method 700 may include determining whether there are any additional potential error patterns to be analyzed at blocks 706-716. If so, the next potential error pattern is selected at block 704 and analyzed at blocks 706-716. Method 700 may proceed until all potential error patterns have been either marked as a candidate error pattern or eliminated.

Figure 8:
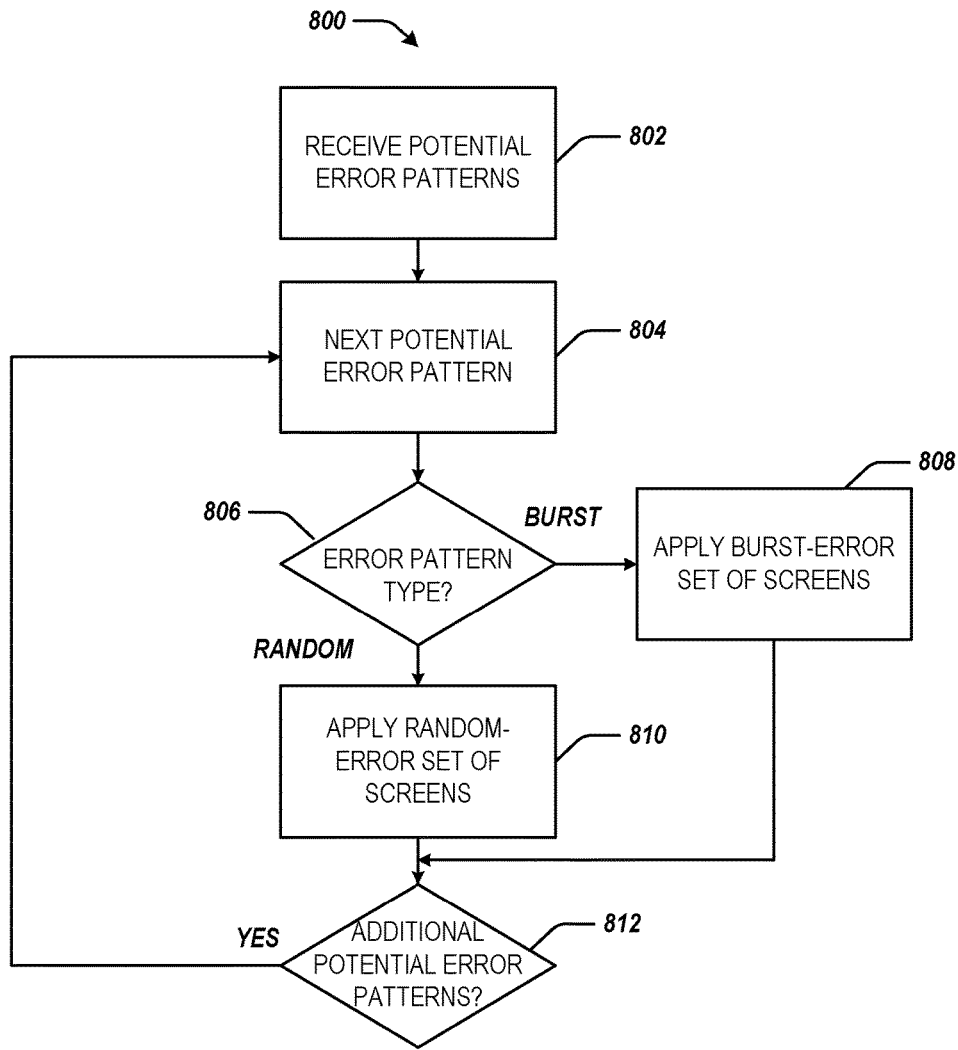
FIG. 8 is a flowchart of an example method for managing results from list decode methods.

FIG. 8 is a flowchart depicting an example method 800 for managing results from list decode methods. Method 800 may be executed or performed, for example, by some or all of the system components described above in list decode management circuit 100 of FIG. 1, list decode management circuit 200 of FIG. 2, error pattern screening circuit 300 of FIG. 3, and/or screening circuit 400 of FIG. 4. Other suitable systems may be used as well. In some examples, steps of method 800 may be executed substantially concurrently or in a different order than shown in FIG. 8. In some examples, method 800 may include more or less steps than are shown in FIG. 8. In some examples, some of the steps of method 800 may, at certain times, be ongoing and/or may repeat.

At block 802, method 800 may include receiving a plurality of potential error patterns for correcting errors in a codeword. The plurality of potential error patterns being generated using a plurality of different list decode methods, such as burst-error list decode methods and random-error list decode methods. Error pattern screening circuit 102 of FIG. 1, error pattern screening circuit 202 of FIG. 2, and/or error pattern screening circuit 300 of FIG. 3 may be responsible for implementing block 702.

At block 804, method 800 may include selecting the next potential error pattern and determining the selected potential error pattern's error pattern type. The error pattern type may be determined based on the type of list decode method from which the error pattern was generated. For example, error patterns generated from a burst-error list decode method may be error patterns of a burst-error type (Block 806—BURST). As another example, error patterns generated from a random-error list decode method may be error patterns of a random-error type (Block 806—RANDOM). Error pattern screening circuit 102 of FIG. 1, error pattern screening circuit 202 of FIG. 2, and/or error pattern screening circuit 300 of FIG. 3 may be responsible for implementing blocks 804 and 806.

At block 808, method 800 may include determining, as candidate error patterns, likely potential error patterns among the plurality of potential error patterns received at block 802 by applying a first set of error pattern screens among a plurality of sets of error pattern screens to potential error patterns generated using burst-error list decode methods. Error pattern screening circuit 102 of FIG. 1, error pattern screening circuit 202 of FIG. 2, and/or error pattern screening circuit 300 of FIG. 3 may be responsible for implementing block 808.

At block 810, method 800 may include determining, as candidate error patterns, likely potential error patterns among the plurality of potential error patterns received at block 802 by applying a second set of error pattern screens among the plurality of sets of error pattern screens to potential error patterns generated using random-error list decode methods. Error pattern screening circuit 102 of FIG. 1, error pattern screening circuit 202 of FIG. 2, and/or error pattern screening circuit 300 of FIG. 3 may be responsible for implementing block 810. The set of error pattern screens applied at block 810 to the potential error patterns resulting from random-error list decode methods may be different from the set of error pattern screens applied at block 808 to the potential error patterns resulting from burst-error list decode methods.

At block 812, method 800 may include determining whether there are any additional potential error patterns to be analyzed at blocks 806-810. If so, the next potential error patterns is selected at block 804 and analyzed at blocks 806-810. Method 800 may proceed until all potential error patterns have been analyzed. Error pattern screening circuit 102 of FIG. 1, error pattern screening circuit 202 of FIG. 2, and/or error pattern screening circuit 300 of FIG. 3 may be responsible for implementing block 812.

The foregoing disclosure describes a number of example circuit implementations and methods for managing results from list decode methods. For purposes of explanation, certain examples are described with reference to the components illustrated in FIGS. 1-5. The functionality of the illustrated components may overlap, however, and may be present in a fewer or greater number of elements and components. Further, all or part of the functionality of illustrated elements may co-exist or be distributed among several geographically dispersed locations.

Further, the sequence of operations described in connection with FIGS. 6-8 are examples and is not intended to be limiting. Additional or fewer operations or combinations of operations may be used or may vary without departing from the scope of the disclosed examples. Furthermore, implementations consistent with the disclosed examples need not perform the sequence of operations in any particular order. Thus, the present disclosure merely sets forth possible examples of implementations, and many variations and modifications may be made to the described examples. All such modifications and variations are intended to be included within the scope of this disclosure and protected by the following claims.

The invention claimed is:

1. A method for managing results from list decode methods, the method performed by a list decode management circuit and comprising:

receiving a plurality of potential error patterns for correcting errors in a codeword, the plurality of potential error patterns being generated using a plurality of different list decode methods;

determining, with an error pattern screening circuit, candidate error patterns among the plurality of potential error patterns using a set of error pattern screens;

assigning error weights to each of the candidate error patterns based on a quantity of bit errors in each symbol included in the candidate error patterns;

adjusting, using a scaling factor, error weights assigned to candidate error patterns that are indicative of a memory device failure; and selecting, with an error pattern selection circuit, from among the candidate error patterns, an error pattern to correct the errors in the codeword based on the assigned error weights.

2. The method of claim 1, wherein a first error pattern screen in the set of error pattern screens includes a first threshold quantity of bit errors.

3. The method of claim 2, wherein determining candidate error patterns among the plurality of potential error patterns using a set of error pattern screens comprises:

comparing a quantity of bit errors in each of the plurality of potential error patterns to the first threshold quantity of bit errors.

4. The method of claim 3, wherein determining candidate error patterns comprises:

marking potential error patterns among the plurality of potential error patterns that have a quantity of bit errors that does not exceed the first threshold quantity of bit errors as candidate potential error patterns.

5. The method of claim 2, wherein a second error pattern screen in the set of error pattern screens comprises:

excluding, from the potential error patterns, bit errors from a symbol error value having a greatest quantity of bit errors; and comparing a remaining quantity of bit errors in the potential error patterns to a second threshold quantity of bit errors in the second error pattern screen.

6. The method of claim 5, wherein determining candidate potential error patterns comprises:

marking potential error patterns that have a remaining quantity of bit errors that does not exceed the second threshold quantity of bit errors as candidate potential error patterns.

7. The method of claim 1, comprising:

determining candidate error patterns among the plurality of potential error patterns using a plurality of sets of error pattern screens.

8. The method of claim 7, wherein determining candidate error patterns among the plurality of potential error patterns using the plurality of sets of error pattern screens comprises:

applying a first of the plurality of sets of error pattern screens to potential error patterns among the plurality of potential error patterns resulting from random-error list decode methods; and applying a second of the plurality of sets of error pattern screens to potential error patterns among the plurality of potential error patterns resulting from burst-error list decode methods.

9. A list decode circuit, comprising:

an error pattern screening circuit to determine, using a plurality of sets of error pattern screens, candidate error patterns among a plurality of potential error patterns generated using a plurality of different list decode methods for correcting errors in a codeword;

an error pattern weighting circuit to assign, using a weighting schema, error weights to each of the candidate error patterns based on a quantity of bit errors in each symbol included in the candidate error patterns;

a weight adjustment circuit to adjust, using a scaling factor, error weights assigned to candidate error patterns that are indicative of a memory device failure; and an error pattern selection circuit to select, among the candidate error patterns, an error pattern to correct the errors in the codeword based on the assigned error weights.

10. The list decode circuit of claim 9, wherein the error pattern weighting circuit is to assign an error weight to a candidate error pattern by:

calculating symbol weights for each symbol in the candidate error pattern; and summing the calculated symbol weights.

11. The list decode circuit of claim 10, wherein the error pattern weighting circuit is to calculate symbol weights for each symbol in the candidate error pattern by multiplying a quantity of bit errors in each symbol by a symbol error weight according to the weighting schema.

12. The list decode circuit of claim 11, wherein the weighting schema is selected based on a likelihood of a correlation of bit errors in the symbols in the candidate error pattern.

13. The list decode circuit of claim 12, wherein a weighting schema specifying a linear and directly proportional relationship between quantity of bit errors in a symbol and symbol error weight is selected when a correlation of bit errors in the symbols in the candidate error pattern is not likely.

14. The list decode circuit of claim 12, wherein a weighting schema specifying a non-linear relationship between quantity of bit errors in a symbol and symbol error weight is selected when a correlation of bit errors in the symbols in the candidate error pattern is somewhat likely.

15. The list decode circuit of claim 12, wherein a weighting schema specifying a constant symbol error weight is selected when a correlation of bit errors in the symbols in the candidate error pattern is very likely.

16. A list decode circuit, comprising:

an error pattern screening circuit to determine, using a plurality of sets of error pattern screens, candidate error patterns among a plurality of potential error patterns generated using a burst-error list decode method and a random-error list decode method for correcting errors in a codeword;

an error pattern weighting circuit to assign, using a weighting schema, error weights to each of the candidate error patterns based on a quantity of bit errors in each symbol included in the candidate error patterns after symbol errors contributed by a failed memory device have been excluded from candidate error patterns that are indicative of a memory device failure;

a weight adjustment circuit to adjust, using a scaling factor, error weights assigned to the candidate error patterns that are indicative of a memory device failure; and an error pattern selection circuit to select, among the candidate error patterns, an error pattern to correct the errors in the codeword based on the assigned error weights.

17. The list decode circuit of claim 16, wherein the error pattern selection circuit is to select, among the candidate error patterns, an error pattern with a lowest assigned error weight to correct the errors in the codeword.

18. The list decode circuit of claim 16, wherein the weight adjustment circuit is to select the scaling factor among a first scaling factor and a second scaling factor, the first scaling factor having a scaling magnitude less than a scaling magnitude of the second scaling factor.

19. The list decode circuit of claim 18, wherein the weight adjustment circuit is to select the first scaling factor as the scaling factor when the memory device failure is confirmed.

20. The list decode circuit of claim 18, wherein the weight adjustment circuit is to select the second scaling factor as the scaling factor when the memory device failure is not confirmed.

* * * * *